(12) United States Patent
Kato

(10) Patent No.: US 7,629,810 B2
(45) Date of Patent: Dec. 8, 2009

(54) INPUT AND OUTPUT CIRCUIT

(75) Inventor: Kunihiko Kato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/839,668

(22) Filed: Aug. 16, 2007

(65) Prior Publication Data
US 2008/0042685 A1   Feb. 21, 2008

(30) Foreign Application Priority Data
Aug. 16, 2006   (JP) ............... 2006-221982

(51) Int. Cl.
*H03K 19/00* (2006.01)
(52) U.S. Cl. .............. 326/16; 326/82; 326/91
(58) Field of Classification Search ............. 326/69–83, 326/66, 115, 121, 127, 29
See application file for complete search history.

(56) References Cited

U.S. PATENT DOCUMENTS

| | | | |
|---|---|---|---|
| 6,847,232 B2* | 1/2005 | Tinsley et al. ........... | 326/84 |
| 6,933,743 B2* | 8/2005 | Cecchi et al. ........... | 326/16 |
| 7,012,450 B1* | 3/2006 | Oner et al. ............. | 326/86 |
| 7,061,273 B2* | 6/2006 | Wang et al. ............ | 326/86 |
| 7,132,847 B1* | 11/2006 | Wong et al. ........... | 326/29 |
| 7,279,937 B2* | 10/2007 | Aliahmad et al. ....... | 326/115 |

FOREIGN PATENT DOCUMENTS

| | | |
|---|---|---|
| JP | HEI11-202029 | 7/1999 |
| JP | 2000-101414 | 4/2000 |
| JP | 2001-094410 | 4/2001 |
| JP | 2004-088641 | 3/2004 |
| JP | 2006-060416 | 3/2006 |

* cited by examiner

*Primary Examiner*—James H. Cho
*Assistant Examiner*—Crystal L Hammond
(74) *Attorney, Agent, or Firm*—Scully, Scott, Murphy & Presser, P.C.

(57) ABSTRACT

Stable testing is performed on an input and output circuit. An output stage outputting output signal to input/output terminal DQ comprises: a differential pair formed from an Nch transistor N1, having as load a Pch transistor P1 and resistance element R1, and an Nch transistor N2, having as load a Pch transistor P2 and resistance element R2; and an Nch transistor N3 supplying operating current to the differential pair. The input/output terminal DQ is connected to the drain of the Nch transistor N1. The output stage is operated as differential pair, in the normal operation mode (TM=L), wherein the Pch transistors P1, P2 are ON, a read-data signal RD is supplied to the differential pair, and a specified voltage CC is supplied to the gate of the Nch transistor N3; and in the test mode (TM=H), a CMOS circuit is established wherein a read-data signal RD is supplied to the gate of the Pch transistor P1 and the gate of the Nch transistor N3, turning the Nch transistor N1 ON.

19 Claims, 4 Drawing Sheets the benefit of the priority of Japanese patent application No. 2006-221982, filed on Aug. 16, 2006, the disclosure of which is incorporated herein in its entirety by reference thereto.

INPUT AND OUTPUT CIRCUIT

RELATED APPLICATION

This application is based upon and claims the benefit of the priority of Japanese patent application No. 2006-221982, filed on Aug. 16, 2006, the disclosure of which is incorporated herein in its entirety by reference thereto.

FIELD OF THE INVENTION

The present invention relates to an input/output circuit, and more particularly to an input/output circuit of a semiconductor device comprising a test mode.

BACKGROUND OF THE INVENTION

In recent years, there has been remarkable advancement of high-speed semiconductor devices, and as semiconductor devices become faster, an output circuit having a differential construction as shown in FIG. 4, for example, is currently used in memory devices. In the output circuit shown in FIG. 4, Nch transistors N1 and N2 form a differential pair, and the drain of an Nch transistor N3 for adjusting the output amplitude is connected to the sources of the Nch transistors N1 and N2. In the Nch transistor N3 whose source is grounded, the amplitude of the output signal is adjusted by applying a signal CC as a specified voltage to the gate. Input/output terminals DQ, DQN are connected to the drains of the Nch transistors N1, N2, respectively, and one of the ends of the termination resistors R1, R2 is also respectively connected as a load. The other ends of the termination resistors R1, R2 are respectively connected to the drains of Pch transistors P1, P2 for adjusting the terminating resistance. The drains of the Pch transistors P1, P2 are connected to a power supply, and the gates are grounded. Here, the Pch transistors P1, P2 are in the ON state. During data output, read-data signals RD, /RD (the symbol '/' means the signal is inverted) that are input to the gates of the Nch transistors N1 and N2 as differential signals drive the input/output terminals DQ and DQN. In an output circuit with this kind of construction, in order to increase the operating speed during normal operation, the output amplitude of the input/output terminals DQ, DQN is about several hundred mV.

SUMMARY OF THE DISCLOSURE

The following analysis is given by the present invention.

In an output circuit as shown in FIG. 4, a tester that is capable of checking and testing during normal operation (high-speed operation) is expensive because signals having small amplitudes are required to be handled at a high speed. Therefore, in a wafer test or memory-cell test, it is common to provide a device with a test mode using an inexpensive tester and perform the test at a low speed. However, in the circuit construction shown in FIG. 4, a penetrating current always flows through each of the transistors, P1→N1→N3 or P2→N2→N3, regardless of the polarity of the read-data signal. Therefore, when attempting to increase the number of simultaneous measurements at the output terminal, current consumption will increase. As a result, the number of simultaneous measurements becomes limited. Also, since the output amplitude is small, stability during testing is also impaired, and since an open drain construction is used, attempting to make the amplitude large will invite a further increase in current consumption.

According to a first aspect of the present invention there is provided a novel input/output circuit. The input/output circuit comprises: a first input/output terminal; an output-stage circuit that outputs an output signal to the first input/output terminal; and a control circuit that controls the output-stage circuit so that the output-stage circuit constitutes a differential pair in a normal operation mode, and constitutes a CMOS circuit (for testing that does not constitute the differential pair) in the test mode.

In a first form of the input/output circuit, the output-stage circuit comprises: two cascade-connected circuits in each of which a first conductive type MOS transistor is cascade-connected with a resistance element; a differential pair that is formed by a first and second conductive type MOS transistors, each of which has a load of the cascade-connected circuit; and a third second conductive type MOS transistor that supplies operating current to the differential pair. The control circuit controls the output-stage circuit so that: in the normal operating mode, the two first conductive type MOS transistors are ON, an input signal is supplied to the differential pair, and a specified voltage is supplied to a control end of the third second conductive type MOS transistor; and in the test mode, an input signal is supplied to a control end of one of the first conductive type MOS transistors and a control end of the third second conductive type MOS transistor, the one of the first conductive type MOS transistors being in connection with the first second conductive type MOS transistor; and the first second conductive type MOS transistor is ON.

In a second form of the input/output circuit, the input/output circuit comprises a buffer circuit that is connected to the first input/output terminal, and receives a signal from the first input/output terminal; and the control circuit performs control so that when an input-enable signal is input, in the test mode, the first one of the conductive type MOS transistors and the third second conductive type MOS transistor are OFF.

In a third form of the input/output circuit, the input/output circuit further comprises: a second input/output terminal connected to the drain of the second conductive type MOS transistor, and the control circuit performs control in the test mode so that the second conductive type MOS transistor is OFF.

According to a second aspect of the present invention, there is provided an input and output circuit comprising:

a first input and output terminal;

a second input and output terminal;

an output-stage circuit that comprises a differential pair circuit and outputs an output signal to the first input and output terminal; and a control circuit that controls the output-stage circuit so that the output-stage circuit constitutes a differential pair in a normal operation mode, and constitutes a CMOS circuit in a test mode, the differential pair circuit comprising a pair of MOS transistors of a second conductive type and a common MOS transistor of the second conductive type supplying operating current to the differential pair transistors, and each of the differential pair transistors being connected with a load having a MOS transistor of a first conductive type;

wherein in the test mode, the CMOS circuit is constituted by the common transistor, one of the differential pair transistors and the transistor of the load connected to this one.

The meritorious effects of the present invention are summarized as follows.

With the present invention, the output stage is formed from a CMOS circuit in the test mode, so current consumption is reduced and an output signal having CMOS level amplitude is obtained. Therefore, even when using an inexpensive tester, it is possible to increase the amplitude of the output signal and perform stable testing without limiting the number of simultaneous measurements.

In a further aspect of the present invention, a semiconductor device is provided which comprises the input and output circuit of any of the preceding aspects.

PREFERRED MODES OF THE INVENTION

In an input/output circuit of an exemplary embodiment of the invention, an output stage that outputs an output signal to an input/output terminal (DQ in FIG. 1) comprises: a differential pair that includes an Nch transistor (N1 in FIG. 1) provided with a Pch transistor (P1 in FIG. 1) and resistance element (R1 in FIG. 1) as a load, and a Nch transistor (N2 in FIG. 1) provided with a Pch transistor (P2 in FIG. 1) and a resistance element (R2 in FIG. 1) as a load; and an Neb transistor (N3 in FIG. 1) that supplies operating current to the differential pair. The input/output terminal (DQ in FIG. 1) is connected to the drain of the Nch transistor (N1 in FIG. 1). In the normal operation mode (signal TM=L level), the Pch transistors (P1 and P2 in FIG. 1) are ON, a read-data signal (RD in FIG. 1) is supplied to the differential pair, and a specified voltage (CC in FIG. 1) is supplied to the gate of the Nch transistor (N3 in FIG. 1), whereby the output stage is operated as a differential pair. In the test mode (signal TM=H level), a read-data signal (RD in FIG. 1) is supplied to the gate of the Pch transistor (P1 in FIG. 1) and the gate of the Nch transistor (N3 in FIG. 1), the Nch transistor (N1 in FIG. 1) is ON, and a CMOS circuit is established in the output stage.

In a device having this kind of output circuit with differential construction comprising termination resistance, during the test mode, a CMOS inverter circuit is constructed using the Pch transistor (P1 in FIG. 1) for enabling the termination resistance (R1 in FIG. 1) and the Nch transistor (N3 in FIG. 1) for adjusting the output level. With this kind of construction, in the test mode, stable testing becomes possible by increasing the output amplitude under reduction in the current consumption. The preferred examples of the invention will be explained below with reference to the drawings.

Example 1

Figure 1:
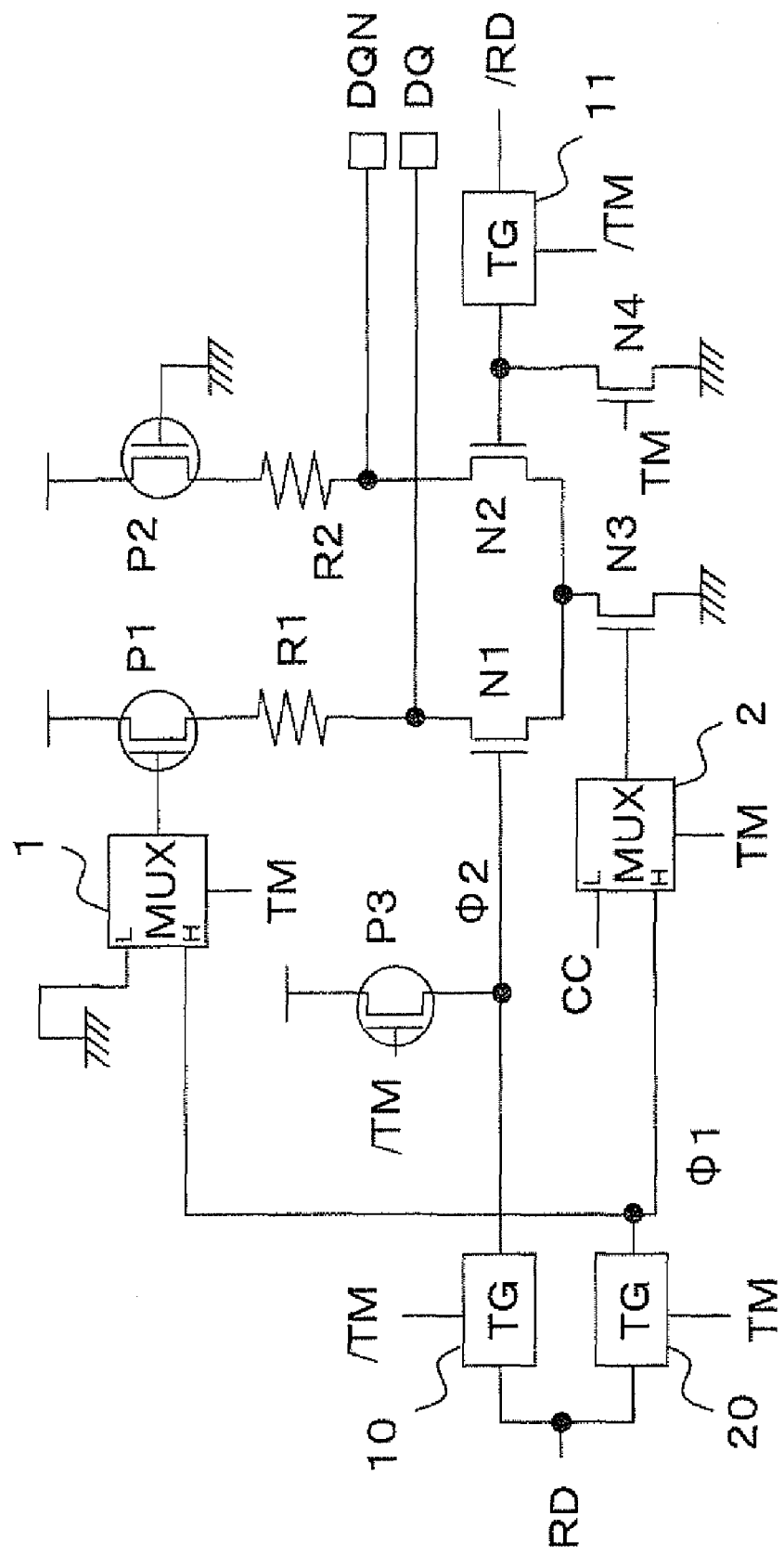
FIG. 1 is a circuit diagram showing the construction of an output circuit of a first exemplary embodiment of the invention.

FIG. 1 is a circuit drawing showing the construction of an output circuit of a first example of the invention. In FIG. 1, the input/output circuit comprises: Nch transistors N1, N2, N3, N4; Pch transistors P1, P2, P3, termination resistors R1, R2, multiplexers MUX 1, 2; transfer gates TG 10, 11, 20; and input/output terminals DQ, DQN.

A read-data signal RD is input via a transfer gate 20 to one of the input ends of the multiplexer 1 as signal Φ1. The output of the multiplexer 1, whose other input end is grounded, is connected to the gate of the Pch transistor P1. Also, the signal Φ1 is input to one input end of the multiplexer 2, and the output of multiplexer 2, to which signal CC is input to the other input end, is connected to the gate of the Nch transistor N3, whose source is grounded. The signal CC is a signal that is used for adjusting the output amplitude in the normal operation mode.

Here, the multiplexers 1, 2 select a signal according to the polarity (H or L) of the test mode signal TM. The test mode signal TM is a signal that is L level during normal operation, and becomes H level in the test mode. Also, the transfer gates 10, 11 become non conductive (open) in the test mode, and the transfer gate 20 is conductive (short circuited) in the test mode.

The drain of the Pch transistor P1, whose source is connected to the power supply, is connected to the input/output terminal DQ and the drain of the Nch transistor N1 via the termination resistor R1. Also, the Pch transistor P2, whose source is connected to the power supply and whose gate is grounded, is connected to the input/output terminal DQN and to the drain of the Nch transistor N2 via the termination resistor R2. The sources of the Nch transistors N1, N2 are connected in common to the drain of the Nch transistor N3, to form a differential pair.

A signal /TM that has the opposite phase of the test mode signal TM is supplied to the gate of the Pch transistor P3, and that Pch transistor P3 pulls up the gate of the Nch transistor N1 in the test mode. A test mode signal TM is supplied to the gate of the Nch transistor N4, and that Nch transistor N4 pulls down the gate of the Nch transistor N2 in the test mode.

The input/output terminal DQ and input/output terminal DQN are output terminals for the differential output signals. In the test mode, the Nch transistor N2 turns OFF the input/output terminal DQN, and output data is output only from the input/output terminal DQ.

In the construction described above, in the normal mode, or in other words, when the level of the test mode signal TM is L, the read-data signal RD is input to the gate of the Nch transistor N1 by way of the transfer gate 10 as signal Φ2. On the other hand, the read-data signal /RD is input to the gate of the Nch transistor N2 by way of the transfer gate 11. The output signals that are amplified by the differential pair comprising the Nch transistors N1, N2 are output from (first) input/output terminal DQ and (second) input/output terminal DQN as differential signals. That is, when a semiconductor device on which the input/output circuit is mounted is a memory device, the read-data signals RD, /RD pass through the input/output circuit, i.e., correspond to input signals, and are output to the outside from the input/output terminals DQ, DQN. In FIG. 1, the Pch transistor P2 is always ON, and the Pch transistor P1 is ON in the normal mode. When it is not necessary to use the termination resistors R1, R2, control can be performed by means not shown in the figure so that the gates of the Pch transistors P1, P2 become high level.

On the other hand, in the test mode, the level of the test mode signal TM is at H level, so the transfer gate 20 is short circuited (conductive) and the read-data signal RD is supplied to the gate of the Pch transistor P1 by way of the multiplexer MUX 1 as signal Φ1. Also, the read-data signal RD is supplied to the gate of the Nch transistor N3 by way of the multiplexer MUX 2. Moreover, when a signal /TM that has the opposite phase as the test mode signal TM is input to the gate of the Pch transistor P3, the Pch transistor P3 becomes ON. Therefore, the level of signal Φ2 is always at H level, and the Nch transistor N1 is set to the ON state.

In other words, when the level of the test mode signal is at H level, a CMOS inverter circuit is formed by the Pch transistor P1 and Nch transistor N3, and a signal amplitude having CMOS level is output to the input/output terminal DQ. Also, since the level of the test mode signal TM is at H level, the Nch transistor N4 is set to the ON state, and the gate level of the Nch transistor N2 becomes L level, so the Nch transistor N2 is always in the OFF state. Therefore, the penetrating current that flows through the Pch transistor P2 and termination resistor R2 is nearly zero '0' and can be ignored.

Example 2

Figure 2:
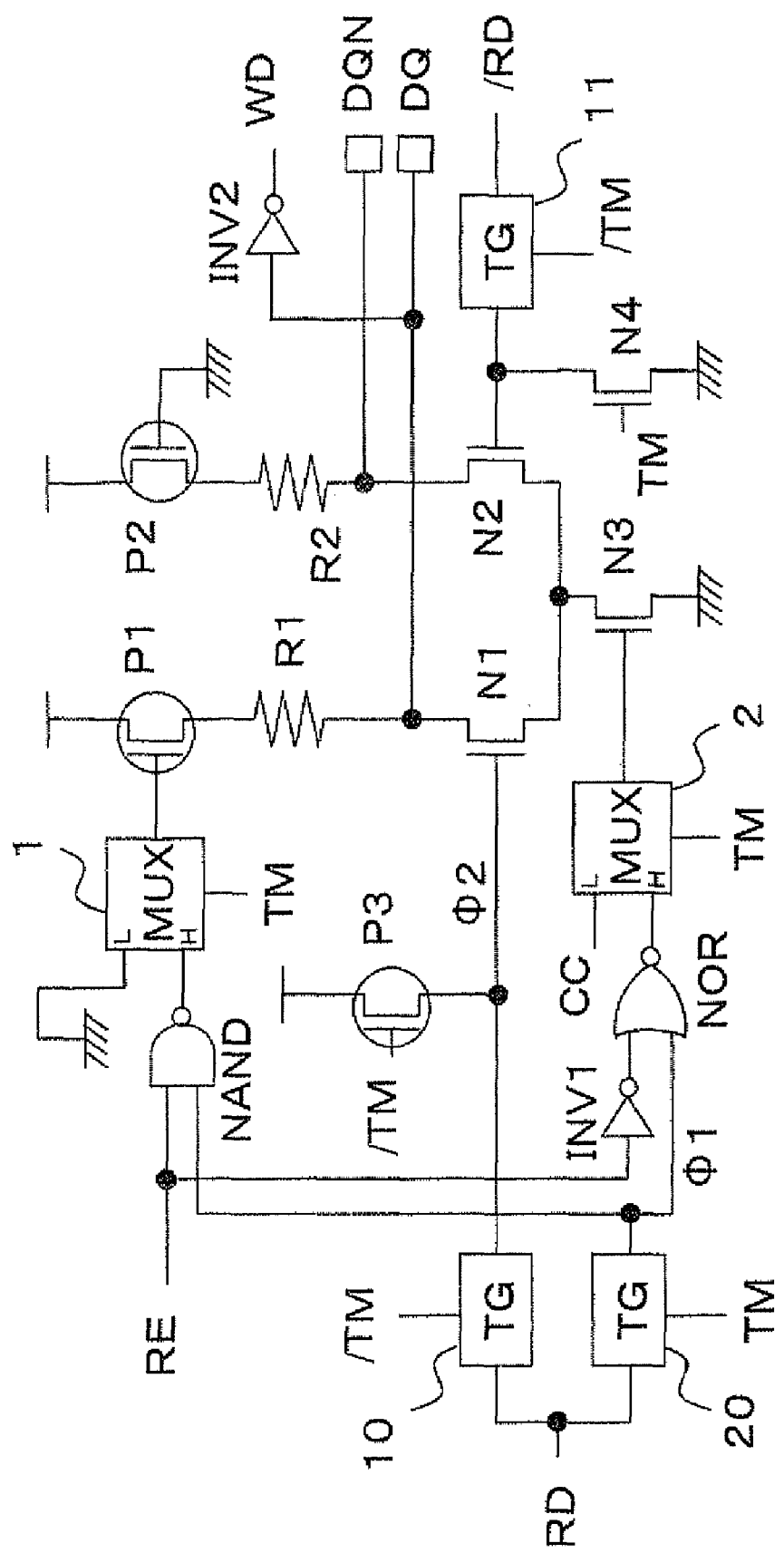
FIG. 2 is a circuit diagram showing the construction of an output circuit of a second exemplary embodiment of the invention.

FIG. 2 is a circuit diagram showing the construction of an output circuit of a second example of the invention. In FIG. 2, the same reference numbers are given to parts that are identical to those in FIG. 1, and an explanation of them is omitted. The output circuit that is shown in FIG. 2 is the circuit shown in FIG. 1 to which a NAND circuit NAND, NOR circuit NOR, and inverter circuits INV1, INV2 have been added, and the output circuit also functions as an input circuit.

In FIG. 2, the read-data signal RD is input to one input end of the NAND circuit NAND via the transfer gate 20 as signal Φ1. The output of the NAND circuit NAND is input to the gate of the Pch transistor P1 by way of the multiplexer 1. Also, signal Φ1 is input to one input end of the NOR circuit NOR, and is input to the gate of the Nch transistor N3 by way of the multiplexer 2.

A read-enable signal RE that becomes H level only during data output is input to the other input end of the NAND circuit NAND, and the read-enable signal RD is inverted by the inverter circuit INV1 and input to the other input end of the NOR circuit NOR as a signal having opposite phase.

The input end of the inverter circuit INV2 is connected to the input/output terminal DQ, and it inverts the signal that is provided to the input/output terminal DQ and outputs the result as signal WD. In other words, when the semiconductor device on which the input/output circuit is mounted is a memory device, a signal that is provided to the input terminal DQ from the outside is provided to the internal circuits (not shown in the figure) as the signal WD that corresponds to a write-data signal.

With this kind of construction, the level of the read-enable signal RE during data input becomes L level, so the level of the output of the NAND circuit NAND becomes H level regardless of the signal Φ1, and the Pch transistor P1 is set to the OFF state. Also, the level of the output of the NOR circuit NOR is L level regardless of the signal Φ1, and the Nch transistor N3 is also set to the OFF state. Therefore, as an input/output circuit the impedance of the differential pair becomes high impedance, so in the test mode, there is no interference of the tester input signal that is input from the input/output terminal DQ.

Figure 3:
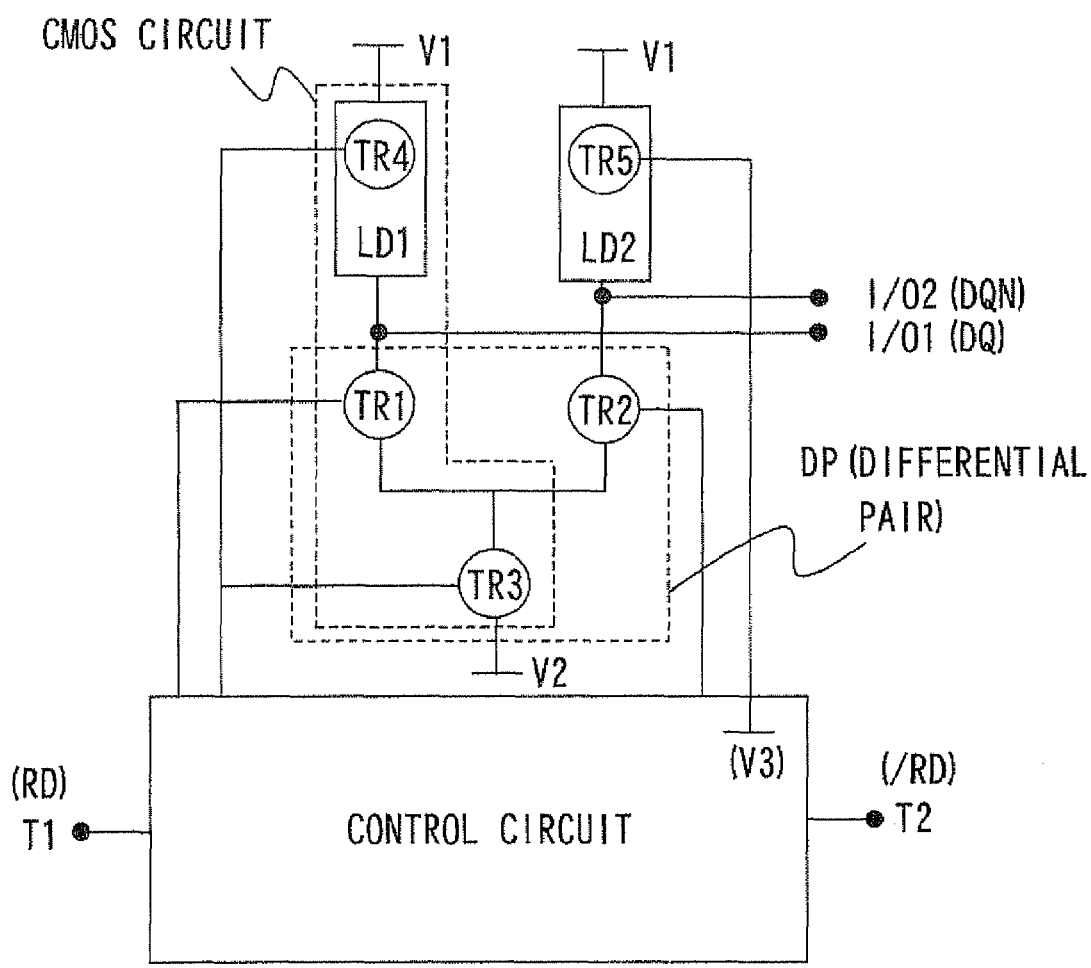
FIG. 3 is a circuit diagram showing a third exemplary embodiment of the present invention.
Figure 4:
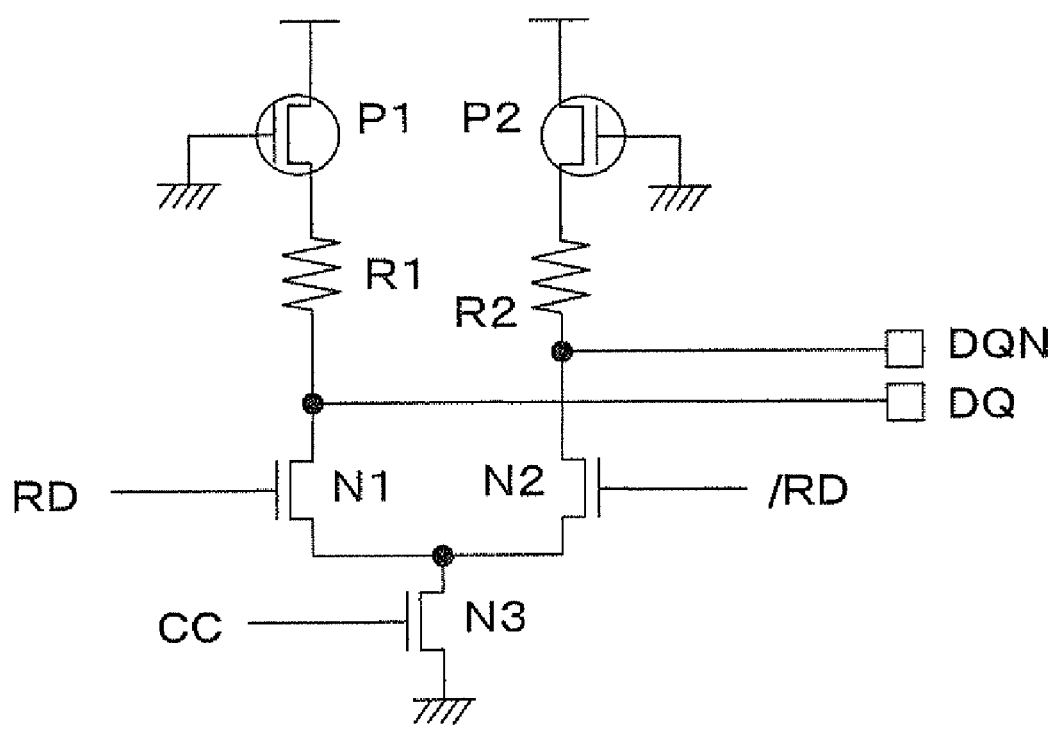
FIG. 4 is a circuit diagram showing an example of the construction of an output circuit having a conventional differential construction.

As a third exemplary embodiment, reference is made to FIG. 3 which shows a block diagram of an output stage circuit. The output stage circuit includes a differential pair circuit DP comprising a differential pair of first and second transistors TR1 and TR2 (MOS transistors) supplied with operating current by a third (common) transistor TR3 connected in common with the differential pair transistors TR1 and TR2. Each of the differential pair transistors TR1, TR2 is connected with a load LD1, LD2, which is further connected to a first power supply V1.

Each of the load LD1, LD2 may have a resistor (not shown). One of the loads LD1 has a fourth transistor TR4, while the other has a fifth transistor TR5. The third transistor is connected to a second power supply V2, whereas a gate of the fifth transistor (TR5) may be controlled by a potential (V3). V2 and V3 may be grounded.

For instance, the first through third transistors may be a first conductive type, whereas the fourth and fifth transistors may be the second conductive type. The same applies vise verse.

First and second input and output terminals (I/O1, I/O2) are connected to a node connecting the first transistor TR1 and the first load LD1, and a node connecting the second transistor TR2 and the second load LD2, respectively.

A control circuit supplies a control signal to the first transistor TR1 and the third and fourth transistors (TR3, TR4), which establishes a CMOS circuit as encircled with a dotted line across the first and second power supplies (V1-V2) in a test mode.

The control circuit also supplies an inversed control signal to the second transistor TR2, turning OFF in the test mode.

The general control for the normal operation is performed according to the conventional art or in a manner analogous to the preceding examples of the present invention, and thus the detailed explanation is omitted here.

To the control circuit, a data signal T1 (e.g., read data signal RD) and a reversal thereof T2 (e.g., /RD) are supplied, which are further supplied to the respective transistors, e.g., via a transfer gate and/or multiplexer (or suitable supply means including, e.g., switching or gate means).

From FIG. 3, it is well understood how the differential pair, which operates usually as itself under the normal operating mode, can be converted to a CMOS circuit.

According to this exemplary embodiment, it is understood that the following input and output circuit can be established.

An input and output circuit comprises:
a first input and output terminal (I/O1);
a second input and output terminal (I/O2);
an output-stage circuit that comprises a differential pair circuit and outputs an output signal to the first input and output terminal; and
a control circuit that controls the output-stage circuit so that the output-stage circuit constitutes a differential pair in a normal operation mode, and constitutes a CMOS circuit in a test mode,
the differential pair circuit comprising a pair of MOS transistors (TR1, TT2) of a second conductive type and a common MOS transistor (TR3) of the second conductive type supplying operating current to the differential pair transistors, and
each of the differential pair transistors being connected with a load (LD1, LD2) having a MOS transistor of a first conductive type;
wherein in the test mode, the CMOS circuit is constituted by the common transistor (TR3), one (e.g., TR1) of the differential pair transistors and the transistor (e.g., TR4) of the load (LD1) connected to this one (TR1).

The present invention was explained using the preferred examples, however, the invention is not limited to the examples described above, and of course includes various variations and changes that are within the range and scope of the invention and that can be performed by someone skilled in the art.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An input and output circuit comprising:
a first input and output terminal;

an output-stage circuit that outputs an output signal to said first input and output terminal; and a control circuit that controls said output-stage circuit so that said output-stage circuit constitutes a differential pair in a normal operation mode, and constitutes a CMOS circuit in a test mode, wherein said output-stage circuit comprises:

two cascade-connected circuits in each of which a first conductive type MOS transistor is series-connected with a resistance element;

said differential pair being formed by a first and second conductive type MOS transistors each of which has a load of said cascade-connected circuit; and a third second conductive type MOS transistor that supplies operating current to said differential pair; and wherein said control circuit controls said output-stage circuit so that:

in said normal operating mode, said two first conductive type MOS transistors are ON, an input signal is supplied to said differential pair, and a specified voltage is supplied to a control end of said third second conductive type MOS transistor; and in said test mode, the input signal is supplied to a control end of one of said first conductive type MOS transistors, said one being in connection with said first second conductive type MOS transistor, and the input signal is supplied to a control end of said third second conductive type MOS transistor, with said first second conductive type MOS transistor being ON regardless of the input signal to maintain an ON state.

2. The input and output circuit of claim 1 further comprising:

a buffer circuit of an input-stage circuit that is connected to said first input and output terminal, and receives an external signal from a source outside said input and output circuit via said first input and output terminal; wherein said control circuit performs control so that when an input-enable signal is input, in said test mode, said one of the first conductive type MOS transistors and said third second conductive type MOS transistor are OFF.

3. The input and output circuit of claim 2 further comprising a second input and output terminal connected to the drain of said second conductive type MOS transistor; and said control circuit performs control in said test mode so that said second conductive type MOS transistor is OFF.

4. A semiconductor memory device comprising the input and output circuit of claim 3.

5. A semiconductor memory device comprising the input and output circuit of claim 2.

6. The input and output circuit of claim 1 further comprising a second input and output terminal connected to the drain of said second conductive type MOS transistor; and said control circuit performs control in said test mode so that said second conductive type MOS transistor is OFF.

7. A semiconductor memory device comprising the input and output circuit of claim 6.

8. A semiconductor memory device comprising the input and output circuit of claim 1.

9. An input and output circuit comprising:

a first input and output terminal;

an output-stage circuit that outputs an output signal to said first input and output terminal; a buffer circuit that is connected to said first input and output terminal, and receives a signal from said first input and output terminal; and a control circuit that controls said output-stage circuit so that said output-stage circuit constitutes a differential pair in a normal operation mode, and constitutes a CMOS circuit in a test mode, wherein;

said output-stage circuit comprises:

two cascade-connected circuits in each of which a first conductive type MOS transistor is series-connected with a resistance element;

said differential pair being formed by a first and second conductive type MOS transistors each of which has a load of said cascade-connected circuit; and a third second conductive type MOS transistor that supplies operating current to said differential pair; and wherein said control circuit controls said output-stage circuit so that:

in said normal operating mode, said two first conductive type MOS transistors are ON, an input signal is supplied to said differential pair, and a specified voltage is supplied to a control end of said third second conductive type MOS transistor; and in said test mode, the input signal is supplied to a control end of one of said first conductive type MOS transistors, said one being in connection with said first second conductive type MOS transistor, and the input signal is supplied to a control end of said third second conductive type MOS transistor, with said first second conductive type MOS transistor being ON regardless of the input signal to maintain an ON state;

said control circuit further performing control so that when an input-enable signal is input, in said test mode, said one of the first conductive type MOS transistors and said third second conductive type MOS transistor are OFF.

10. The input and output circuit of claim 9 further comprising a second input and output terminal connected to the drain of said second conductive type MOS transistor; and said control circuit performs control in said test mode so that said second conductive type MOS transistor is OFF.

11. An input and output circuit comprising:

a first input and output terminal;

a second input and output terminal;

an output-stage circuit that comprises a differential pair circuit and outputs an output signal to said first input and output terminal; and a control circuit that controls said output-stage circuit so that said output-stage circuit constitutes a differential pair in a normal operation mode, and constitutes a CMOS circuit in a test mode, said differential pair circuit comprising a pair of MOS transistors of a second conductive type and a common MOS transistor of the second conductive type supplying operating current to the differential pair of MOS transistors, and each of said differential pair of MOS transistors being connected with a load having a MOS transistor of a first conductive type;

wherein in the test mode, said CMOS circuit is constituted by said common MOS transistor of second conductive type and the MOS transistor of a first conductive type, and an input signal is supplied to a control end of the common MOS transistor and a control end of the MOS transistor of a first conductive type, with one of the MOS transistors of a second conductive type being ON regardless of the input signal to maintain an ON state.

12. The input and output circuit of claim 11, wherein:
each of said loads comprises a first conductive type MOS transistor series-connected with a resistance element; and wherein
said control circuit controls said output-stage circuit so that:
in said normal operating mode, said two first conductive type MOS transistors are ON, an input signal is supplied to said differential pair, and a specified voltage is supplied to a control end of said third second conductive type MOS transistor; and
in said test mode, the input signal is supplied to a control end of one of said first conductive type MOS transistors, said one being in connection with said first second conductive type MOS transistor, and the input signal is supplied a control end of said third second conductive type MOS transistor, with said first second conductive type MOS transistor being ON regardless of the input signal to maintain an ON state.

13. The input and output circuit of claim 12 further comprising:
a buffer circuit of an input-stage circuit that is connected to said first input and output terminal, and receives an external signal from a source outside said input and output circuit via said first input and output terminal; wherein
said control circuit performs control so that when an input-enable signal is input, in said test mode, said one of the first conductive type MOS transistors and said third second conductive type MOS transistor are OFF.

14. The input and output circuit of claim 13 further comprising
a second input and output terminal connected to the drain of said second conductive type MOS transistor; and
said control circuit performs control in said test mode so that said second conductive type MOS transistor is OFF.

15. The input and output circuit of claim 12 further comprising
a second input and output terminal connected to the drain of said second conductive type MOS transistor; and
said control circuit performs control in said test mode so that said second conductive type MOS transistor is OFF.

16. A semiconductor device comprising:
a first input terminal supplied with a first input signal;
a first output terminal;
first and second power supply lines;
a transistor circuit including a first node, a first transistor of a first conductivity type coupled between the first power supply line and the first output terminal, a second transistor of a second conductivity type coupled between the first output terminal and the first node, and a third transistor of the second conductivity type coupled between the first node and the second power supply line; and
a control circuit controlling the transistor circuit to operate in one of a normal mode and a test mode, wherein in the normal mode of the transistor circuit, the control circuit supplied a control electrode of the first transistor with a first bias voltage to render the first transistor conductive, a control electrode of the second transistor with the first input signal, and a control electrode of the third transistor with a second bias voltage to render the third transistor conductive, and in the test mode of the transistor circuit, the control circuit supplies the control electrode of the first transistor with the input signal in place of a first bias voltage, the control electrode of the second transistor with a third bias voltage in place of the first input signal to render the second transistor conductive, and the control electrode of the third transistor with the input signal in place of the second bias voltage.

17. The semiconductor device according to claim 16, wherein the first bias voltage takes a level of the second power supply line, the second bias voltage takes a predetermined level, and the third bias voltage takes a level of the first power supply line.

18. The semiconductor device according to claim 16, wherein the control circuit comprises:
a first circuit having a first end supplied with the first bias voltage, a second end supplied with the input signal, and a third end coupled to the control electrode of the first transistor, the first circuit forming an electrical path between the first and third ends during the normal mode of the transistor circuit and between the second and third ends during the test mode of the transistor circuit;
a second circuit having a fourth end supplied with the first input signal, a fifth end supplied with the third bias voltage, and a sixth end coupled of the control electrode of the second transistor, the second circuit forming an electrical path between the fourth and sixth ends during the normal mode of the transistor circuit and between the fifth and sixth ends during the test mode of the transistor circuit; and
a third circuit having a seventh end supplied with the second bias voltage, a eighth end supplied with the first input signal, and a ninth end couple to the control electrode of the third transistor, the third circuit forming an electrical path between the seventh and ninth ends during the normal mode of the transistor circuit and between the eighth and ninth ends during the test mode of the transistor circuit.

19. The semiconductor device according to claim 16, further comprising
a second input terminal supplied with a second input signal and second output terminal, wherein the transistor circuit further comprises:
a first resistive element coupled between the first power supply line and the first output terminal in series with the first transistor;
a fourth transistor of the first conductivity type and a second resistive element coupled between the first power supply line and the second output terminal in series with each other; and
a fifth transistor of the second conductivity type coupled between the second output terminal and the first node, wherein
in normal mode of the transistor circuit, the control circuit supplied a control electrode of the fourth transistor with the first bias voltage to render the fourth transistor conductive and a control electrode of the fifth transistor with the second input signal, and in the test mode of the transistor circuit, the control circuit supplied the control electrode of the fourth transistor with the first bias voltage and the control electrode of the fifth transistor with a fourth bias voltage in place of the second input signal to render the fifth transistor non-conductive.

* * * * *